US012750934B2

(12) United States Patent
Krumm et al.

(10) Patent No.: US 12,750,934 B2
(45) Date of Patent: Sep. 29, 2026

(54) DEVICE FOR GENERATING A CURRENT DRIVER VOLTAGE, AND LASER SYSTEM

(71) Applicant: TRUMPF Laser GmbH, Schramberg (DE)

(72) Inventors: Oliver Krumm, Villingen-Schwenningen (DE); Thomas Kaiser, Oberwolfach (DE); Arno Jakubaschk, Schramberg (DE); Thomas Notheis, Schramberg (DE)

(73) Assignee: TRUMPF LASER GMBH, Schramberg (DE)

( * ) Notice: Subject to any disclaimer, the term of this patent is extended or adjusted under 35 U.S.C. 154(b) by 60 days.

(21) Appl. No.: 18/596,688

(22) Filed: Mar. 6, 2024

(65) Prior Publication Data

US 2024/0215129 A1 Jun. 27, 2024

Related U.S. Application Data

(63) Continuation of application No. PCT/EP2022/073800, filed on Aug. 26, 2022.

(30) Foreign Application Priority Data

Sep. 10, 2021 (DE) ..................... 10 2021 123 547.2

(51) Int. Cl.
*H05B 45/3725* (2020.01)
*H01S 5/026* (2006.01)
*H01S 5/042* (2006.01)

(52) U.S. Cl.
CPC ....... *H05B 45/3725* (2020.01); *H01S 5/0262* (2013.01); *H01S 5/042* (2013.01)

(58) Field of Classification Search
CPC ........................... H05B 45/3725; H05B 45/59; H05B 45/3275; H02M 3/33523; H02M 1/08; H02M 1/0006; H01S 5/0262; H01S 5/042
See application file for complete search history.

(56) References Cited

U.S. PATENT DOCUMENTS 4,899,343 A 2/1990 Wildmann
9,054,485 B1 6/2015 Ng
(Continued)

FOREIGN PATENT DOCUMENTS

DE 3340427 C2 10/1985
DE 102009011254 A1 9/2010
(Continued)

OTHER PUBLICATIONS

Davari Pooya, et al., "High-voltage modular power supply using parallel and series configurations of flyback converter for pulsed power applications," IEEE Transactions on Plasma Science, Oct. 2012, pp. 2578-2587, vol. 40, No. 10, IEEE, Service Center, Piscataway, NJ, USA.

*Primary Examiner* — Patrick C Chen
(74) *Attorney, Agent, or Firm* — LEYDIG , VOIT & MAYER, LTD.

(57) ABSTRACT

A device for generating a current driver voltage for a current driver of a pump diode is provided. The pump diode is configured for pumping a fibre laser. The device includes a voltage source for generating the current driver voltage. The voltage source includes a primary side and a secondary side. The secondary side is electrically isolated from the primary side. The primary side includes primary circuit breakers. The secondary side includes an accumulator for electrical charge. The voltage source is configured to generate the current driver voltage at the accumulator by switching the primary circuit breakers. The device further includes a discharge circuit configured to receive a discharge trigger voltage and to discharge the accumulator when the discharge trigger voltage assumes a predetermined value or a value range.

17 Claims, 10 Drawing Sheets

(56) References Cited

U.S. PATENT DOCUMENTS

| | | | |
|---|---|---|---|
| 10,362,644 | B1 | 7/2019 | Xiong |
| 2007/0201521 | A1 | 8/2007 | Yoshimatsu |
| 2010/0308655 | A1 | 12/2010 | Wachi et al. |
| 2013/0022061 | A1 | 1/2013 | Shimokoshi |
| 2015/0130903 | A1 | 5/2015 | Thompson et al. |
| 2015/0255943 | A1* | 9/2015 | Voloden ............ H01S 3/094003 372/6 |
| 2019/0159308 | A1* | 5/2019 | Eum ...................... H05B 45/10 |
| 2021/0098965 | A1 | 4/2021 | Crawford et al. |
| 2024/0215129 | A1 | 6/2024 | Krumm et al. |

FOREIGN PATENT DOCUMENTS

| | | | |
|---|---|---|---|
| DE | 102009026947 | A1 | 12/2010 |
| DE | 102009026948 | A1 | 12/2010 |
| EP | 0325560 | A1 | 7/1989 |
| EP | 1653578 | A2 | 5/2006 |
| EP | 2226925 | A1 | 9/2010 |
| JP | H07079043 | A | 3/1995 |
| WO | WO 2023036627 | A1 | 3/2023 |

* cited by examiner

DEVICE FOR GENERATING A CURRENT DRIVER VOLTAGE, AND LASER SYSTEM

CROSS REFERENCE TO RELATED APPLICATIONS

This application is a continuation of International Application No. PCT/EP2022/073800 (WO 2023/036627 A1), filed on Aug. 26, 2022, and claims benefit to German Patent Application No. DE 10 2021 123 547.2, filed on Sep. 10, 2021. The aforementioned applications are hereby incorporated by reference herein.

FIELD

Embodiments of the present invention relate to a device for generating a current driver voltage and to a laser system comprising such a device.

BACKGROUND

Due to their coherent and high-energy optical radiation, lasers are an important and often indispensable tool in material processing, production and research. In particular, lasers can generate high radiation energies and can emit laser pulses with high energy densities, which are suitable for separating or melting materials, for example, to initiate a joining process. Laser powers that are suitable for separating and melting materials are typically a danger to organic tissue, especially living human tissue. Accordingly, high safety standards need to be established and adhered to when using a laser in a laboratory and/or production environment.

An important safety factor here is the possibility of shutting down the laser radiation and the associated shutdown time. In a simple mechanical case, shutting down the laser radiation can be achieved by installing a mechanical shutter behind the active medium in which the laser radiation is generated, so that the generated laser radiation does not escape from the laser. However, such a solution is not available for so-called fiber lasers, in which the optical fiber that diverts the laser beam from the laser zone is spliced to the laser diode or a laser diode array. The optical fiber or fibers mean that, in a sense, there is no optical path that can be mechanically interrupted before the laser radiation leaves the laser.

A known solution to the problem is to interrupt the laser beam with a mechanical intermediate piece that is attached to the exit end of the optical fiber. The intermediate piece contains a controllable mechanical shutter so that the laser radiation is interrupted at the end of the optical fiber. However, a mechanical shutter is also subject to mechanical wear, so that the mechanical intermediate piece has to be regularly maintained and replaced. In addition, the mechanical shutter is very slow, with a shutter time in the order of 100 ms to several seconds. In addition, the laser beam often has to be re-coupled into an optical fiber after passing through the mechanical shutter. Such intermediate pieces are correspondingly expensive and time-consuming to adjust and carry the risk of a loss of performance due to the adjustment effort.

SUMMARY

Embodiments of the present invention provide a device for generating a current driver voltage for a current driver of a pump diode. The pump diode is configured for pumping a fibre laser. The device includes a voltage source for generating the current driver voltage. The voltage source includes a primary side and a secondary side. The secondary side is electrically isolated from the primary side. The primary side includes primary circuit breakers. The secondary side includes an accumulator for electrical charge. The voltage source is configured to generate the current driver voltage at the accumulator by switching the primary circuit breakers. The device further includes a discharge circuit configured to receive a discharge trigger voltage and to discharge the accumulator when the discharge trigger voltage assumes a predetermined value or a value range.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
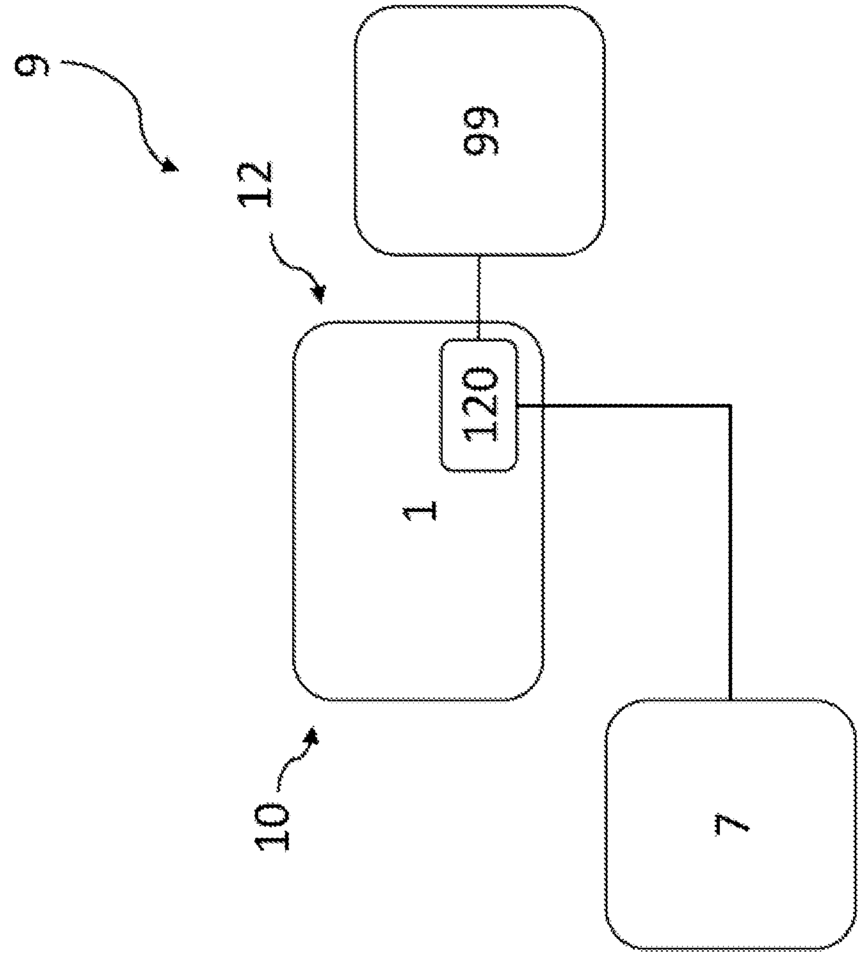
FIG. 1 shows a schematic representation of a first embodiment of the device.

Embodiments of the present invention provide an improved device for generating a current driver voltage for a current driver of a pump diode, preferably for a fiber laser pumped with the pump diode.

A device is provided for generating a current driver voltage for a current driver of a pump diode, in particular for a fiber laser pumped with the pump diode, comprising a voltage source for generating the current driver voltage, wherein the voltage source comprises a primary side and a secondary side, wherein the secondary side is electrically isolated from the primary side, wherein the primary side comprises primary circuit breakers and wherein the secondary side comprises an accumulator for electrical charge, wherein the voltage source is configured to generate the current driver voltage at the accumulator by switching the primary circuit breakers. According to some embodiments, a discharge circuit is configured to receive a discharge trigger voltage and to discharge the accumulator when the discharge trigger voltage assumes a predetermined value or value range.

This makes it possible to discharge the accumulator via the discharge circuit so that the voltage source can be switched off quickly and safely. In other words, this achieves a predictable, reliable shut-down behavior that is independent of the respective state of charge of the accumulator.

Here, a current driver is a device that is suitable for providing a current. In particular, the current of the current driver can be used to supply a pump diode with energy, which in turn can be used to pump a fiber laser. By supplying energy to a pump diode in this way, laser radiation can be generated indirectly, for example, and is used for a variety of applications in technology and science. In the pump diode, the supplied electrical energy causes a population inversion here of the electronic states, which relax into their basic electronic levels by emitting coherent radiation.

The current driver of the pump diode requires a voltage supply here. This voltage supply is realized by a voltage source that has a primary side and a secondary side. The primary side and the secondary side can be electrically isolated from each other. The two sides are electrically isolated if no electrical conduction is possible between the sides, but both sides can interact with each other. In particular, this allows both sides to be at different potentials so that the respective parts of the voltage supply can be ideally configured according to their respective tasks. An electrical isolation in the sense of the application can, for example, be a galvanic separation.

For example, the voltage source can comprise a transformer with a primary side and a secondary side, wherein the primary side and secondary side of the transformer are the primary side and secondary side of the voltage source. This allows a voltage applied to the primary side to cause a voltage on the secondary side via inductive coupling. The ratio of the two voltages can be set by the physical properties of the transformer, such as the number of windings, height, width and length of the transformer coils and so on.

The primary side here can include primary circuit breakers. The primary circuit breakers can be regarded here as voltage-controlled resistors that conduct or block a current on the basis of a received switching signal. For example, the primary circuit breakers may be transistors or power transistors or MOSFETs or bipolar transistors or insulated gate bipolar transistors (IGBTs).

If the primary circuit breakers are switched on, for example, a transformer supply voltage can build up a voltage on the primary side of the transformer so that a secondary voltage is formed on the secondary side of the voltage source between two output terminals of the transformer.

An accumulator for electrical charge is arranged here between the two output terminals of the transformer of the voltage source, which is charged indirectly by the transformer supply voltage. Here, the voltage that drops across the accumulator is the current driver voltage for supplying the current driver. The accumulator has the task here of stabilizing the current driver voltage for the current driver between the output terminals of the secondary side. Typically, the secondary side of the voltage source is therefore designed as a low-pass filter in order to smooth out any switching signals or voltage peaks.

Furthermore, diodes can also be used on the secondary side to ensure a certain current direction or polarity of the accumulator.

Accordingly, by switching the primary circuit breakers on the primary side of the voltage source, the accumulator can be charged to an extent on the secondary side of the voltage source, wherein the current driver voltage drops across the accumulator.

According to embodiments of the invention, the electrical energy accumulator can be discharged by the discharge circuit. For this purpose, the discharge circuit receives a discharge trigger voltage. If the discharge trigger voltage assumes a predetermined value or value range, the accumulator is discharged by the discharge circuit, or a discharge of the accumulator is triggered by the discharge circuit.

Receiving the discharge trigger voltage can, for example, consist of connecting the discharge circuit to a DC voltage supply or to a node of the circuit network at which a discharge trigger voltage is provided.

For example, the specified value of the discharge trigger voltage can be 0V. If the discharge trigger voltage assumes this value, the accumulator is discharged by the discharge circuit. In other words, the discharge circuit can be activated when the DC voltage supply is shut down or set to the value 0V.

However, it is also possible that the discharge circuit discharges the accumulator if the discharge trigger voltage is below or above a threshold value of the discharge trigger voltage. For example, the value range of the discharge trigger voltage can be between 0V and 5V or below 10V or above 20V. For example, the threshold value of the discharge trigger voltage is at least 0V and/or at most 30V.

However, it can also be possible that the value range is to be understood in terms of absolute value. For example, the discharge trigger voltage can then be below a value. For example, the absolute value of the discharge trigger voltage may be below 30V, so that the discharge trigger voltage may actually lie within an interval of −30V to +30V, so that the discharge circuit discharges the accumulator.

Preferably, the discharge trigger voltage for realizing a safety function is below a certain value, so that the discharge process is initiated by a shut-down or a failure of the DC voltage supply, which provides the discharge trigger voltage. The functionality of the discharge circuit can thus be controlled via a kind of inverse switch that activates the discharge circuit when the DC voltage supply is deactivated.

The device may comprise a driver circuit for switching the primary circuit breakers of the voltage source, wherein the driver circuit comprises a switching element which is configured to receive a first switching signal and to switch the primary circuit breakers of the voltage source based thereon.

A driver circuit generally prepares the switching process of a transistor in order to keep the switching time and the associated switching losses as short and low as possible.

A first switching element can be a voltage- or current-controlled switch, for example a transistor. The primary circuit breakers can be switched by switching the first switching element, i.e., by establishing a voltage- or current-controlled electrical connection between two nodes of the circuit. A voltage supply can therefore be provided indirectly by the voltage source by switching the first switching element, or the accumulator for electrical energy can be charged by switching the switching element of the driver circuit.

The first switching element is switched by a first switching signal. A switching signal can, for example, be a voltage, in particular a square wave voltage, or a sawtooth voltage or another voltage form that has a certain duty cycle. Such a switching signal enables the voltage source to be switched on and off periodically, for example.

The switching element switches here based on the value of the switching signal. For example, the switching element can switch when the switching signal exceeds or falls below a certain value. However, it is also possible for the switching element to be switched on and off gradually and proportionally to the switching signal.

In particular, a common voltage supply can be used to supply the driver circuit and/or to supply or switch the discharge circuit. This voltage supply can be realized via a DC/DC converter, wherein switching of this voltage supply is made possible via a deactivation switch.

A DC/DC converter can be configured here to receive a first control voltage and to provide an output voltage at an output of the DC/DC converter based on the first control voltage.

A DC/DC converter can generate an output voltage with a higher, lower or inverted voltage level from the first control voltage.

A deactivation switch can be configured to receive a second control voltage and switch an electrical connection between the output of the DC/DC converter and the node based on the second control voltage.

The deactivation switch thus makes it possible to provide the output voltage of the DC/DC converter at the node for the discharge circuit. A node here is in particular a point in the potential distribution of the circuit network that is at a certain potential.

A deactivation switch can be designed here as an optocoupler. An optocoupler is an optoelectronic component that comprises a light-emitting diode or laser diode and a phototransistor. When an input voltage is applied to the light-emitting diode, it starts to light up. The phototransistor receives the light from the light-emitting diode and can then switch an electrical connection so that an output voltage can be provided. The output voltage remains as long as the light-emitting diode emits light to the phototransistor. The input voltage can be a second control voltage here in particular.

The optocoupler therefore also provides electrical isolation between the input circuit and the output circuit, as there is no electrical connection between the light-emitting diode and the phototransistor.

In particular, the output voltage of the DC/DC converter can be switched here by the second control voltage as the output voltage of the deactivation switch. This means that the output voltage of the DC/DC converter is provided at the node by the deactivation switch in particular.

The discharge circuit can be connected here to a node in order to receive the discharge trigger voltage.

This has the advantage that the discharge circuit can be switched in at least two different ways, as explained below.

The deactivation switch can be configured to establish the electrical connection between the output of the DC/DC converter and the node if the second control voltage has a first value or value range, and to disconnect the electrical connection between the output and the node if the second control voltage has a second value or value range that is different from the first value or value range.

If the electrical connection is established by the second control voltage, the discharge trigger voltage at the node is therefore equal to the output voltage of the DC/DC converter; if the electrical connection is not established, the discharge trigger voltage at the node is equal to earth or undefined. If, on the other hand, the first control voltage of the DC/DC converter is zero, the deactivation switch can in principle provide a conductive connection, but no output voltage of the DC/DC converter is provided, so that switching the deactivation switch has no effect.

For example, the deactivation switch can establish the electrical connection if the second control voltage has a value of 10V or has a value of more than 10V and can disconnect the electrical connection if the second control voltage has a value of less than 5V or has a value of less than 10V, in particular a value of 0V.

Due to the electrical connection, the output voltage of the DC/DC converter can apply a voltage of 15V or 25V to the node, whereas if there is no electrical connection or no output voltage of the DC/DC converter, the node is at ground or in an undefined state.

However, it is also possible that the deactivation switch establishes the electrical connection if the second control voltage has a value of less than 10V and disconnects the electrical connection if the second control voltage has a value of more than 10V.

The discharge circuit may comprise a second deactivation switch, a second switching element and a discharge resistor connected to a first connector of the accumulator, wherein the second deactivation switch is configured to receive the discharge trigger voltage of the node and to switch the second switching element based on the discharge trigger voltage.

As already described, the accumulator is connected between two output terminals on the secondary side of the voltage source. A discharge resistor of the discharge circuit is therefore connected to one of these output terminals. In a sense, the discharge resistor provides a reservoir for the electrical energy of the accumulator.

The second deactivation switch receives here the discharge trigger circuit of the node, which is provided, for example, by the first deactivation switch and the DC/DC converter on the node. As the second deactivation switch receives the discharge trigger voltage, the second deactivation switch is controlled by the discharge trigger voltage. The second deactivation switch can be designed here as an optocoupler.

The second deactivation switch switches a second switching element on or off. The second switching element is configured to switch an electrical connection between the discharge resistor and the second connector of the accumulator.

If the second deactivation switch establishes an electrical connection between the discharge resistor and the second connector of the accumulator, the accumulator is discharged via the discharge resistor. If the second deactivation switch does not establish an electrical connection between the discharging resistor and the second connector of the accumulator, the accumulator is not discharged via the discharge resistor.

The second deactivation switch may be configured to switch on the second switching element to establish an electrical connection between the discharge resistor and a second connector of the accumulator, so that the accumulator is discharged via the discharge resistor when the discharge trigger voltage at the node assumes the first value or value range, or the second deactivation switch may be configured to switch off the second switching element to disconnect the electrical connection between the discharge resistor and the second connector of the accumulator, so that the accumulator is prevented from being discharged via the discharge resistor if the discharge trigger voltage does not assume the first value or value range and/or if the discharge trigger voltage is outside the first value or value range.

The discharge circuit can comprise an indicator circuit configured to output an indicator signal with a first value or value range when the accumulator is discharged via the discharge resistor and to output the indicator signal with a second value or value range when the accumulator is not discharged via the discharge resistor.

This makes it possible to determine whether the accumulator is being discharged or not, or to indicate whether the discharge circuit is activated so that the accumulator is discharged.

An indicator circuit can, for example, tap a voltage here in parallel with the second switching element. If an electrical connection is established by the second switching element and the accumulator is discharged via the discharge resistor, the indicator circuit can detect this voltage and, for example, can transmit it to an output via an optocoupler or another electrically isolated signal transmission path so that the discharge of the accumulator via the discharge resistor is indicated there.

The first control voltage and/or the second control voltage can be controlled by a control trigger, in particular the control trigger can be a test switch, door opener or an emergency stop switch, wherein the accumulator is discharged via the discharge circuit when the control trigger is actuated.

For example, an emergency stop switch or a door opener can interrupt the first control voltage via an integrated or separate emergency stop device.

In particular, the control trigger is or comprises an interface and/or a device by means of which the accumulator can be discharged if necessary. For example, the control trigger is a control means of the laser system or is integrated into a control means of the laser system.

For example, the test switch can interrupt the second control voltage so that the first deactivation switch switches off the first switching element of the driver circuit so that the primary circuit breakers of the voltage source are switched off.

For example, isolated testing of the discharge circuit can be carried out without affecting other components, such as the DC/DC converter.

In this case, the discharge trigger voltage at the node is interrupted at the same time, so that the second switching element of the discharge circuit is switched on by the second deactivation switch when the value falls below the threshold value, so that the accumulator can be discharged via the discharge resistor of the discharge circuit.

If the first control voltage is interrupted, particularly in the event of a power failure or malfunction, the accumulator can be discharged via the discharge circuit.

For example, if the first control voltage falls below a threshold value, this can result in no output voltage being provided at the first node. As a result, the control element of the driver circuit is switched off so that the accumulator is no longer charged indirectly by the primary circuit breakers. At the same time, if the discharge trigger voltage falls below the threshold value, the second deactivation switch can switch on the second switching element so that the accumulator is discharged via the discharge resistor.

The discharge circuit can be configured and preferably dimensioned to discharge the accumulator in less than 100 ms, preferably in less than 50 ms.

The discharge time is determined in particular by the magnitude of the discharge resistance and the capacity of the accumulator.

With the safe shut-down of laser radiation, the discharge time is also referred to as the reaction time within which the system safely shuts down. In the system described, this can be less than 100 ms, for example 50 ms.

The time until no more laser beam emerges from the laser system is called the stopping time. In a system with an optical shutter, i.e. a mechanical interruption of the laser beam, the stopping time can be over 300 ms, for example 350 ms. In a system with the voltage supply proposed here, however, a stopping time of less than 200 ms, for example 100 ms, can be achieved. Accordingly, a shortened stopping time is accompanied by increased safety.

The discharge circuit can be configured to discharge the accumulator up to a predetermined residual voltage. The discharge circuit can be switchable, in particular can be switched off by means of the second switching element, in such a way that the accumulator retains a predetermined residual voltage during discharge, in particular a residual voltage in the range from 0.1V to 20V, for example a residual voltage in the range from 0.1V to 10V, preferably a residual voltage of less than 10V.

The accumulator can be switched at a rate between 1 Hz and 100 Hz, in particular at a rate of 5 Hz.

This can mean that the accumulator can be recharged on the whole after the device has been shut down. In particular, the entire signal path from the first and second control voltage to the accumulator is taken into account in the discharging and charging process of the accumulator.

The accumulator can be a capacitor here and the capacitance of the capacitor can be less than 10000 μF, preferably less than 5000 μF, preferably 4000 μF or 2000 μF or 1500 μF.

This enables a high stability of the current driver voltage and at the same time ensures a high level of safety due to short discharge times.

The discharge circuit can be redundant in the device and/or the device can comprise at least two discharge circuits.

In particular, this can further increase safety and/or can further reduce the discharge time. For example, it can be achieved that a second discharge circuit discharges the accumulator if the first discharge circuit is defective. At the same time, the indicator circuit can detect and signal such a defect.

The device can have a clock generator which is configured to receive an input clock and the output voltage of the DC/DC converter from the node and to output a clocked switching signal based on the output voltage of the DC/DC converter at the node as the switching signal for switching the switching element.

The clock generator can be designed as an optocoupler, for example, so that the output voltage of the DC/DC converter at the node is the supply voltage for the secondary side of the optocoupler. Accordingly, if the output voltage of the DC/DC converter at the node is interrupted, the clock generator is switched off so that the clock generator does not output a clocked signal for the switching element. Accordingly, the switching element remains switched off. Accordingly, if the clock generator is switched on, the output voltage at the node is received by the switching element at the clock generator's rate.

A further aspect of the invention is a laser system, in particular a fiber laser system, for providing a laser beam, comprising at least one pump diode, a device for generating a current driver voltage for a current driver of the at least one pump diode and a control trigger for deactivating the laser beam, wherein the control trigger is configured to transmit a control trigger signal to the device for deactivating the laser beam, and wherein the control trigger signal causes the current driver voltage to be deactivated.

The laser beam is an output laser beam decoupled from the laser system.

The control trigger means, for example, an interface and/or a device of the laser system which can transmit a control trigger signal to the device for generating the current driver voltage in order to deactivate the laser beam if necessary.

In particular, the control trigger signal can be a switching signal. In particular, a switching signal can include the interruption or establishment of an electrical connection or can be designed as a switching signal to a switch that switches or interrupts an electrical connection.

The device for generating the current driver voltage can be configured to deactivate the current driver voltage and/or the laser beam when the control trigger signal is received in less than 200 ms, preferably less than 100 ms, preferably in less than 50 ms.

In particular, the laser system is configured and/or designed in such a way that deactivation of the current driver voltage causes deactivation of the laser beam coupled out of the laser system.

The device for generating the current drive voltage may be one of the devices described above, wherein the control trigger signal transmitted by means of the control trigger causes a discharge of the accumulator via the discharge circuit. For example, the control trigger signal causes a discharge trigger voltage in the predetermined value or value range to be provided to the discharge circuit to discharge the accumulator.

For example, the control trigger causes an interruption of the first control voltage (SIKDPS), or the control trigger sends an interruption signal to a switch that interrupts the first control voltage so that the accumulator is discharged via the discharge circuit.

Preferred further embodiments of the invention are explained in greater detail by way of the following description of the figures.

Preferred exemplary embodiments are described below with reference to the figures. In this case, elements that are the same, similar or have the same effect are provided with identical reference signs in the different figures, and a repeated description of these elements is omitted in some instances, in order to avoid redundancies.

FIG. 1 schematically shows the device 9 for generating a current driver voltage Vout for a current driver of a pump diode 99. In a first embodiment, a current driver voltage Vout is to be provided for the pump diode 99 by the voltage source 1. The voltage source 1 here comprises an accumulator 120 which may, for example, comprise a capacitor with which the current driver voltage Vout is smoothed or otherwise conditioned in order to reliably supply the pump diode 99 with the current driver voltage.

The voltage source 1 and, in particular, the accumulator 120 can be discharged here via a discharge circuit 7. For this purpose, the discharge circuit 7 can receive a discharge trigger voltage. If the discharge trigger voltage assumes a predetermined value or lies within a predetermined value range, the accumulator 120 of the voltage source 1 can be discharged via the discharge circuit 7 so that the pump diode 99 no longer receives any voltage or the voltage supply is interrupted as quickly as possible, for example within 100 ms or 50 ms.

The voltage source 1 here has a primary side 10 and a secondary side 12, which can be electrically isolated from each other. For example, the voltage source 1 can therefore comprise a transformer with a primary side and a secondary side. Primary circuit breakers can be arranged on the primary side 10 (not shown) and can be used to switch the voltage supply to the secondary side 12.

Figure 2:
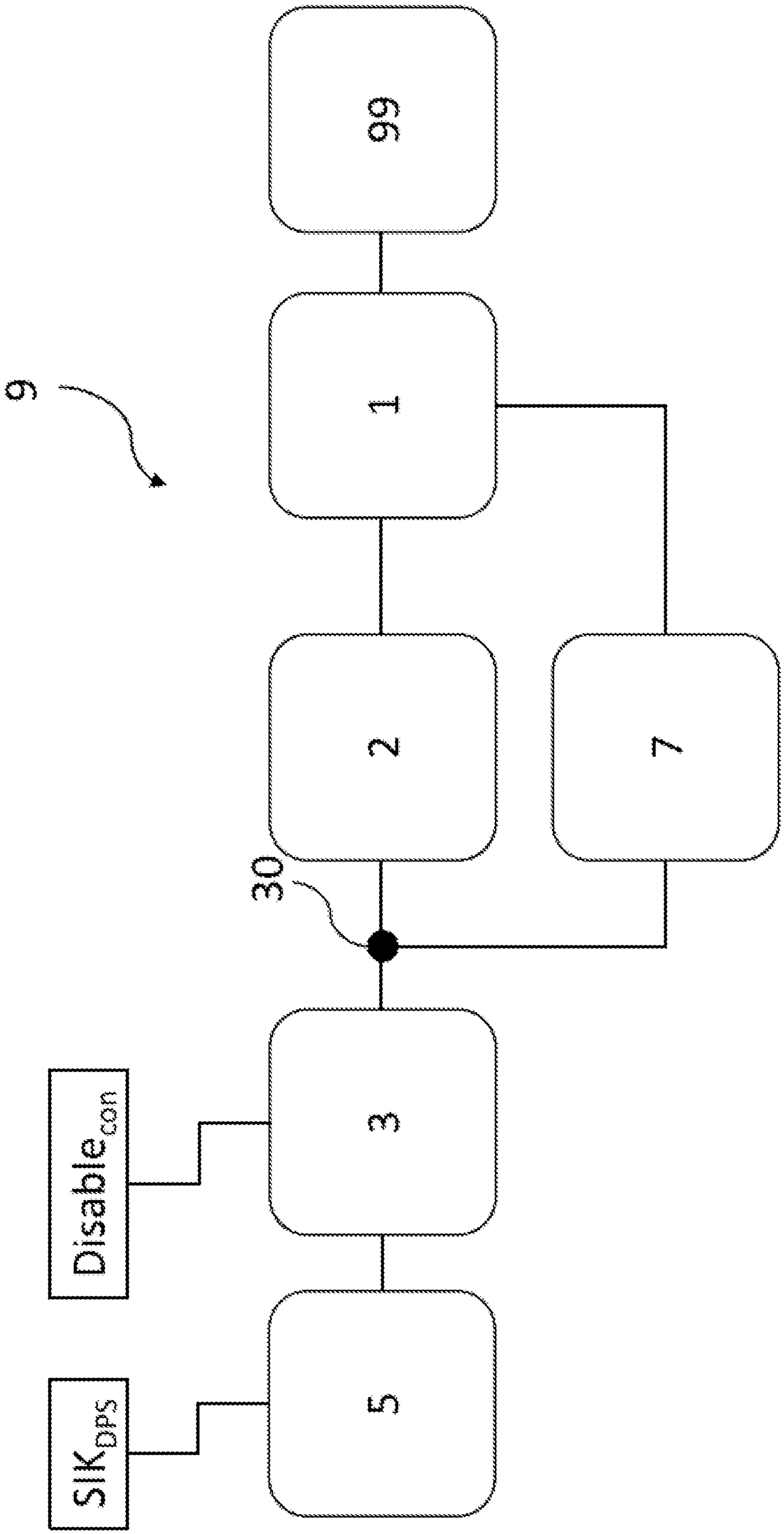
FIG. 2 shows a schematic representation of a second embodiment of the device.

Since the voltage source 1 is not to be operated and discharged via the discharge circuit 7 at the same time, the operating state of the voltage source 1 and the operating state of the discharge circuit 7 can be made dependent on a common reference potential, as shown in FIG. 2.

FIG. 2 shows an embodiment, wherein the voltage source 1 and the discharge circuit 7 are at least indirectly connected to a common node 30, from which a voltage is received. On the one hand, this voltage can be called the output voltage of a DC/DC converter 5, and on the other hand, this voltage can also be called the discharge trigger voltage.

In FIG. 2, the primary switching elements (not shown) of the voltage source 1 are switched by a driver circuit 2. The driver circuit 2 comprises a switching element (not shown) that can receive a switching signal and can switch the primary circuit breakers of the voltage source 1 based on this signal.

For example, node 30 can receive an output voltage from the driver circuit at least indirectly. If the output voltage here assumes a first value or value range, the driver circuit 2 is switched, whereby the primary circuit breakers are switched and thus the voltage source 1 is operated. If the output voltage or now the discharge trigger voltage assumes a second value or value range, the discharge circuit 7 is activated and the voltage source 1 is discharged. At the same time, the voltage source 1 is no longer operated. Accordingly, a certain complementary or inverse circuit property of the driver circuit 2 and of the discharge circuit 7 is preferably realized.

FIG. 2 also shows that the node 30 receives a voltage from a first deactivation switch 3, which in turn is generated by a DC/DC converter 5 based on a first control voltage SIKDPS. At the same time, the first deactivation switch 3 is controlled by a second control voltage Disablecon. When the second control voltage Disablecon conducts the first deactivation switch 3, the output voltage of the DC/DC converter 5 is received at the node 30. If the first deactivation switch is switched non-conductive by the second control voltage Disablecon, or no output voltage is generated by the DC/DC converter, then either the earth potential or an undefined potential is present at the node 30.

The deactivation switch 3 integrates a function into the device 100 that enables the voltage source 1 to be discharged via the discharge circuit 7 if the first control voltage SIKDPS fails, for example in the event of a power failure. At the same time, the voltage source 1 is also discharged when a second control voltage Disablecon is switched on or off, for example by a control trigger, such as a test switch for testing the discharge function. In a sense, several functionalities and safety mechanisms are combined on the first deactivation switch.

An alternative implementation option here would be to replace the deactivation switch 3 with a logical AND gate, so that only one output voltage of the DC/DC converter 5 is present at the node 30 if both a first and a second control voltage Disablecon are present.

In both cases, the voltage source 1 can be discharged quickly via the discharge circuit 7 in order to increase the operational reliability of the device 1.

Figure 3:
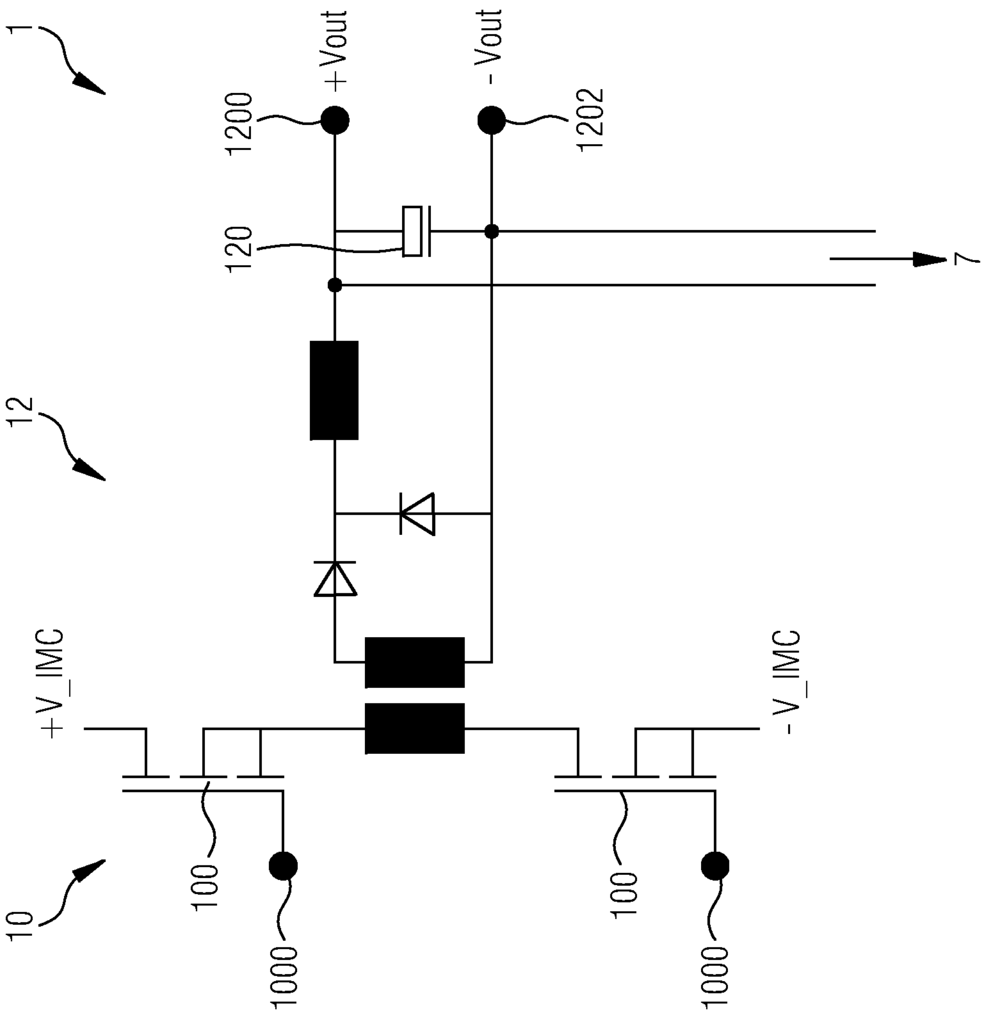
FIG. 3 shows a schematic representation of the voltage source and the accumulator according to some embodiments.

A simplified circuit diagram of the voltage source 1 is shown schematically in FIG. 3. The voltage source 1 has a primary side 10 and a secondary side 12, wherein preferably an inductive coupling exists between the two sides. The secondary side 12 also comprises two output terminals 1200, 1202 between which there is arranged an accumulator for electrical charge 120. The accumulator 120 may, for example, be designed here as a capacitor, of which the capacitance is less than 10000 μF, preferably less than 5000

μF, preferably 1500 μF. For example, the capacitance can be 4000 μF or 2000 μF or 1500 μF.

By arranging the accumulator 120 between the output terminals 1200, 1202 of the secondary side 12, the accumulator 120 stabilizes the current driver voltage Vout of the voltage source 1, with which, for example, a current driver of a pump diode can be supplied with voltage.

Primary circuit breakers 100 are arranged on the primary side 10 of the voltage source 1. In this example, the primary circuit breakers 100 are designed as MOSFETs, which are optimized for conducting and blocking high electrical currents and voltages. If the MOSFETs are switched on via a switching signal at the circuit input 1000, i.e., are switched conductively, then the voltage V_IMC on the primary side 10 generates a voltage on the secondary side 12 due to the inductive coupling, whereby the accumulator 120 is charged.

The starting point of the considerations on which this design is based is to enable the accumulator 120 to be shut down and discharged quickly. Previously, in the event of a fault or an emergency, the charging process of the accumulator 120 was only interrupted by interrupting the voltage supply V_IMC, so that the accumulator only stops storing energy after a time constant, which is determined by the capacity of the accumulator 120, and thus interrupts the voltage supply to the current driver of the pump diode. In a sense, the accumulator had to discharge itself via the pump diode or the load, so that a defined shut-down time could not be achieved.

However, according to the structure now proposed here, the accumulator 120 can now also be discharged in a defined and rapid manner via the discharge circuit 7, as shown below.

Figure 4A:
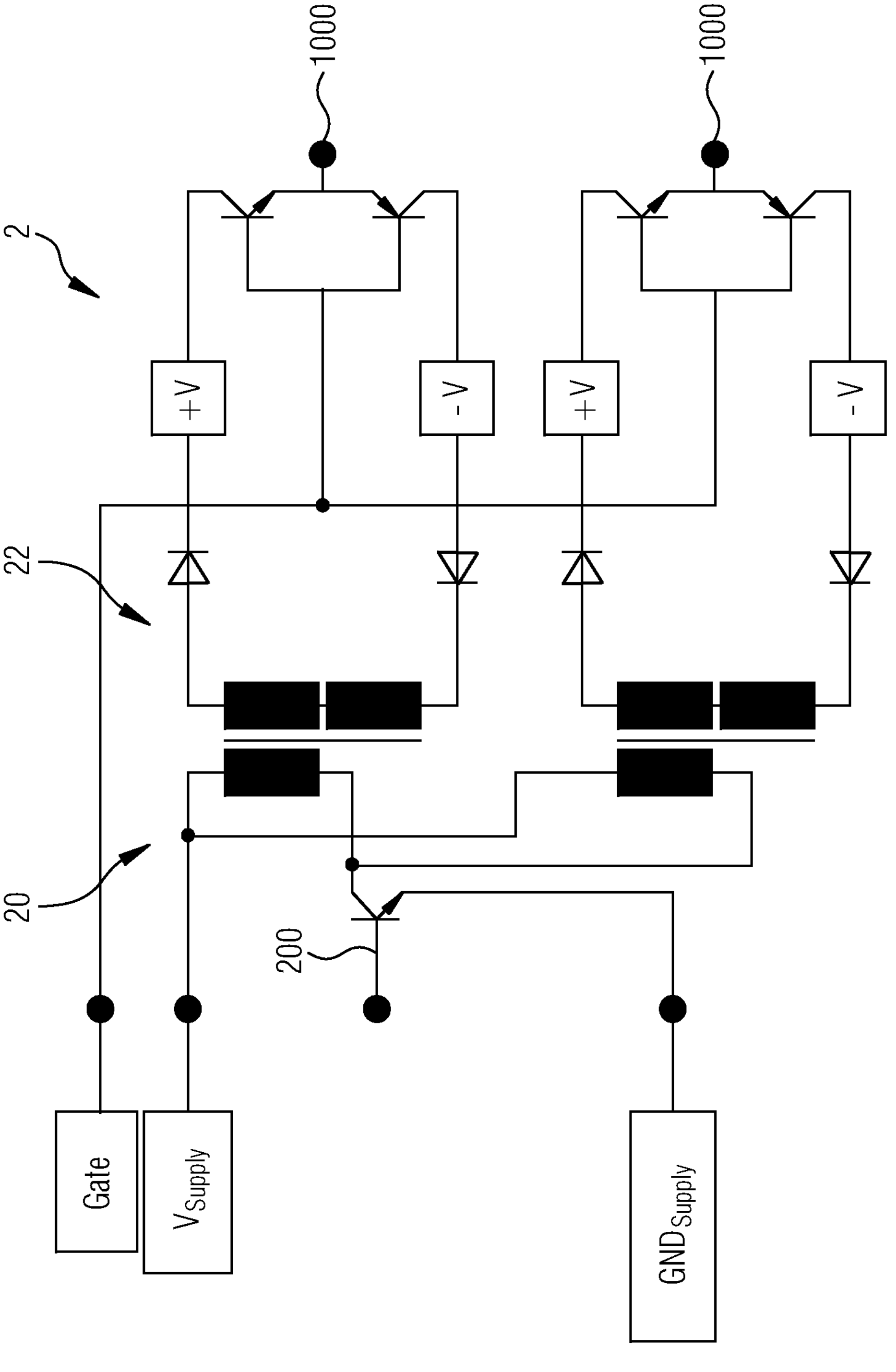
FIGS. 4A and 4B show a schematic illustration of the driver circuit and of the clock generator according to some embodiments.

FIG. 4A shows the driver circuit 2 for switching the primary circuit breakers 100 of the voltage source 1. The driver circuit 2 has a primary side 20 and a secondary side 22, with the primary side 20 and the secondary side 22 being inductively coupled. In the present embodiment, a switching element 200 is arranged on the primary side 20 and can in particular be designed as a transistor. The transistor is a switch that can switch a supply voltage Vsupply of the primary side 20 on and/or off by means of a control voltage or a control current. The switching element 200 receives a first switching signal for this purpose.

The primary side 20 also comprises, for example, two inductors connected in parallel, each of which is part of a transformer or an inductive coupling element. On the secondary side 22 of the driver circuit 2, which is immediately given by the secondary sides 22 of each transformer, the transformed voltage can be amplified by an amplifier and fed to the circuit breakers 100 of the voltage source 1. The amplifier can, for example, be designed here as a CMOS inverter, wherein a supply voltage of the CMOS inverters is generated by the transformers and an amplification can be set by a gate voltage of the CMOS inverters.

So if the switching signal switches the switching element 200 conductively, then the primary side 20 can receive a supply voltage Vsupply, wherein a voltage is induced in the secondary side 22 by the transformers and can switch the primary circuit breakers 100 of the voltage source 1 via the amplifier circuit. If the switching element 200 does not receive a switching signal, then no voltage is induced in the secondary side 22 of the driver circuit 2, so that the primary circuit breakers 100 are not switched.

Figure 4B:
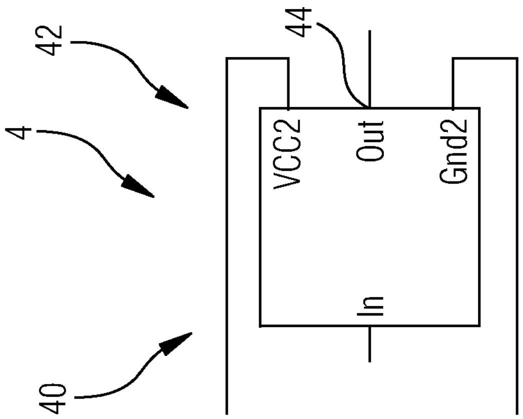

The switching signal of the switching element 200 can, for example, be provided here by a clock generator 4, which is shown as an example in FIG. 4B. The clock generator 4 has an input 40 for this purpose, which is supplied with a clock signal, for example with a square-wave voltage of a specific amplitude. In addition, the clock generator 4 is provided with a voltage input 42, through which the clock generator 4 receives voltage. If the voltage is greater than a critical voltage or threshold voltage, the clock generator 4 can provide an output voltage or the supply voltage at its output 44 in time with the clock signal at the input 40. This allows the switching element 200 to be switched, for example periodically.

In particular, the clock generator 4 can also be designed as an optocoupler. If the supply voltage of the optocoupler falls below a threshold value, the optocoupler does not emit an output voltage, so that the accumulator 120 of the voltage source 1 is not charged. The clock generator 4 can also be connected here, in particular, to the node 30.

Figure 5:
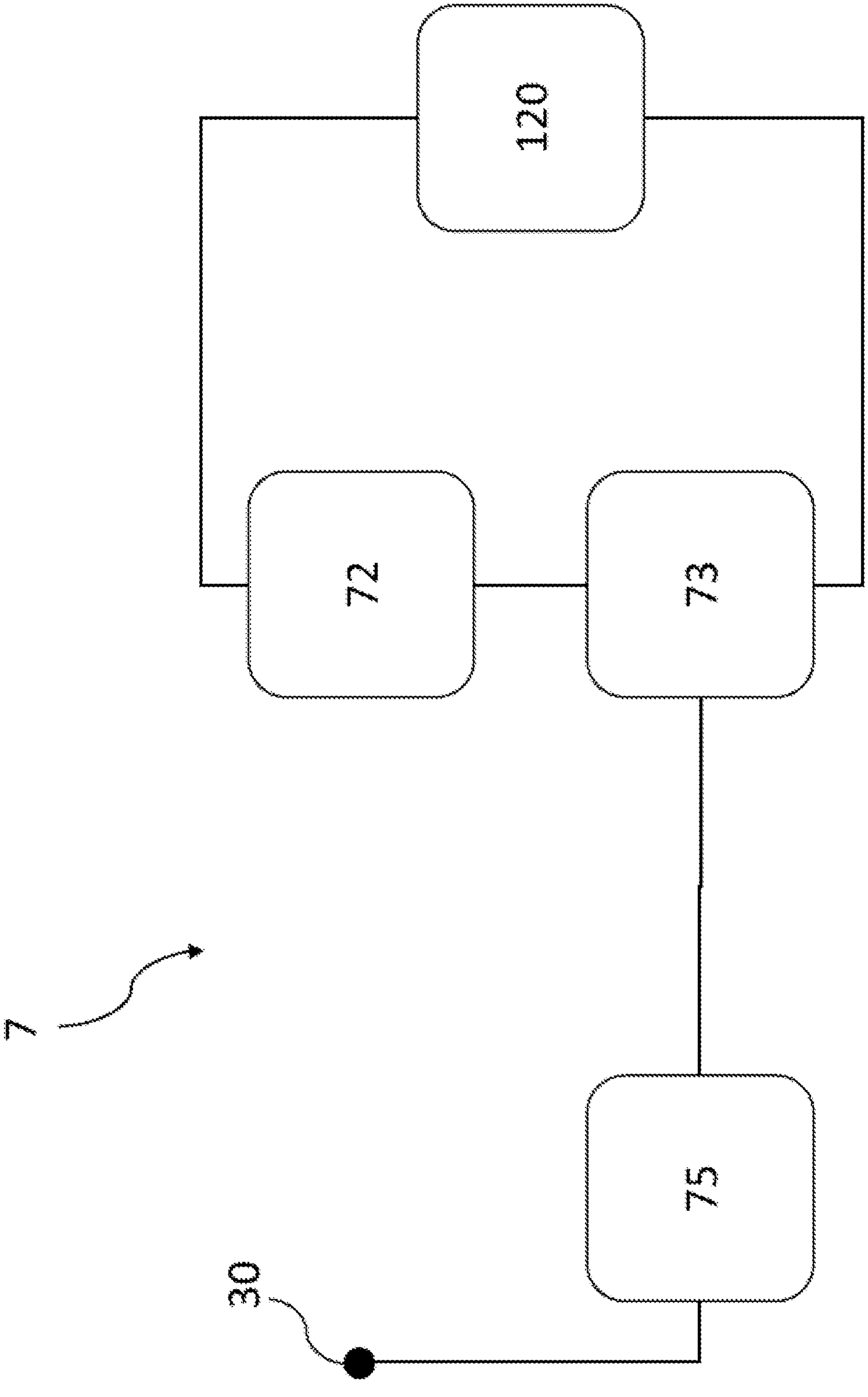
FIG. 5 shows a schematic illustration of the discharge circuit according to some embodiments.

FIG. 5 schematically shows the discharge circuit 7. The discharge circuit 7 has a second deactivation switch 75, which receives the discharge trigger voltage of the node 30. A second switching element 73 can be switched on the basis of the received discharge trigger voltage. The second switching element 73 is connected at one end to a discharge resistor 72, which in turn is connected to a connector of the accumulator 120. The other end of the switching element 73 is connected to the other connector of the accumulator 120. When the switching element 73 is switched based on the received discharge trigger circuit at the deactivation switch 75, an electrical connection of the connectors of the accumulator 120 can be established via the discharge resistor 72, so that the accumulator 120 is discharged via the discharge resistor 72. In the reversed state of the switching element 73, the accumulator 120 is not discharged via the discharge resistor.

Figure 6:
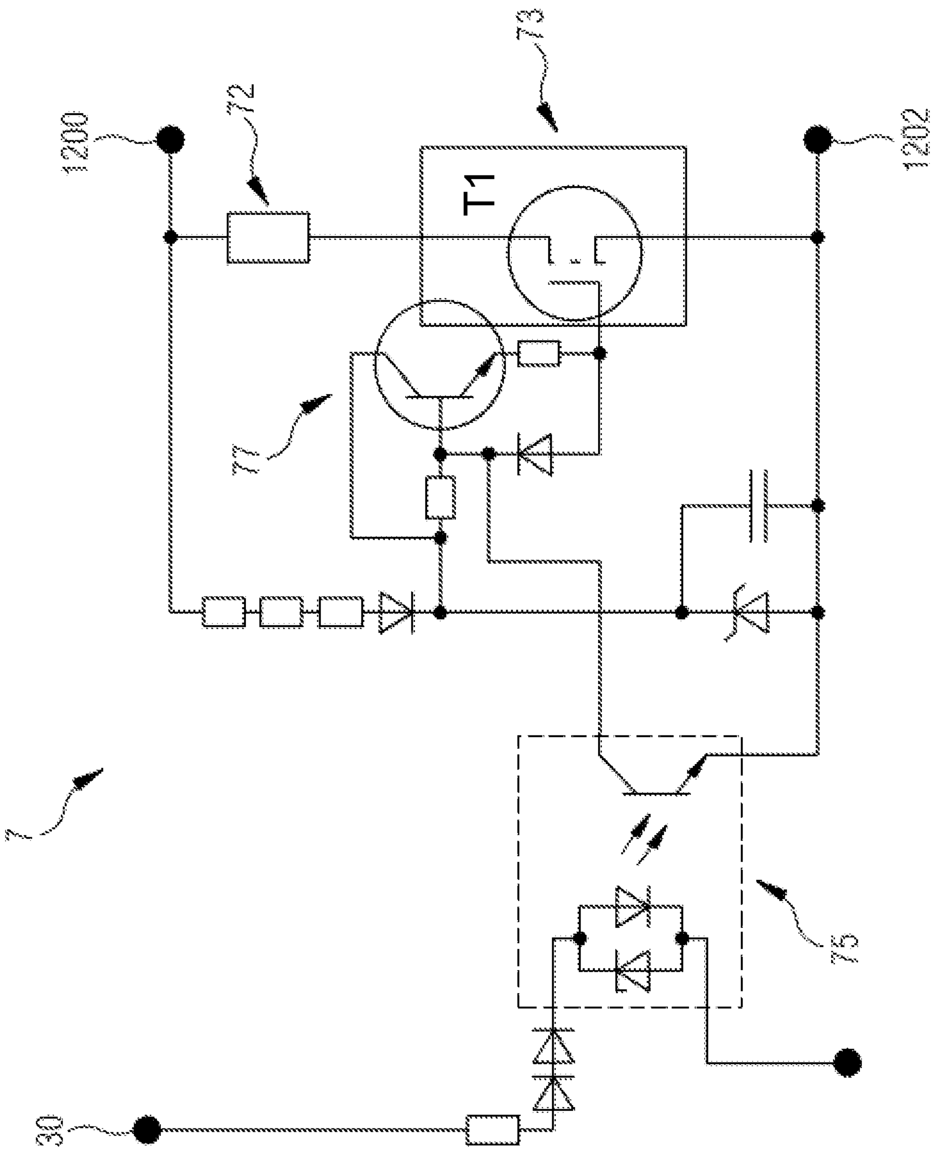
FIG. 6 shows a further schematic representation of the discharge circuit according to some embodiments.

FIG. 6 shows a more detailed representation of the circuit diagram of the discharge circuit 7. Here, the deactivation switch 75 is provided by an optocoupler which receives the discharge trigger voltage. When the optocoupler 75 is activated, the switching element 73 interrupts the electrical connection between the discharge resistor 72 and the accumulator 120, which is connected to the connection terminals 1200, 1202. If, on the other hand, the optocoupler 75 is deactivated, the electrical connection is closed by the switching element 73 until the accumulator 120 is discharged. The transistor 77 is used here to amplify the current and provide a defined switching threshold for the switching element 73.

In particular, the device 9 may also include an indicator circuit 76 that outputs or does not output an indicator signal when the accumulator 120 is discharged via the discharge resistor 72.

Figure 7:
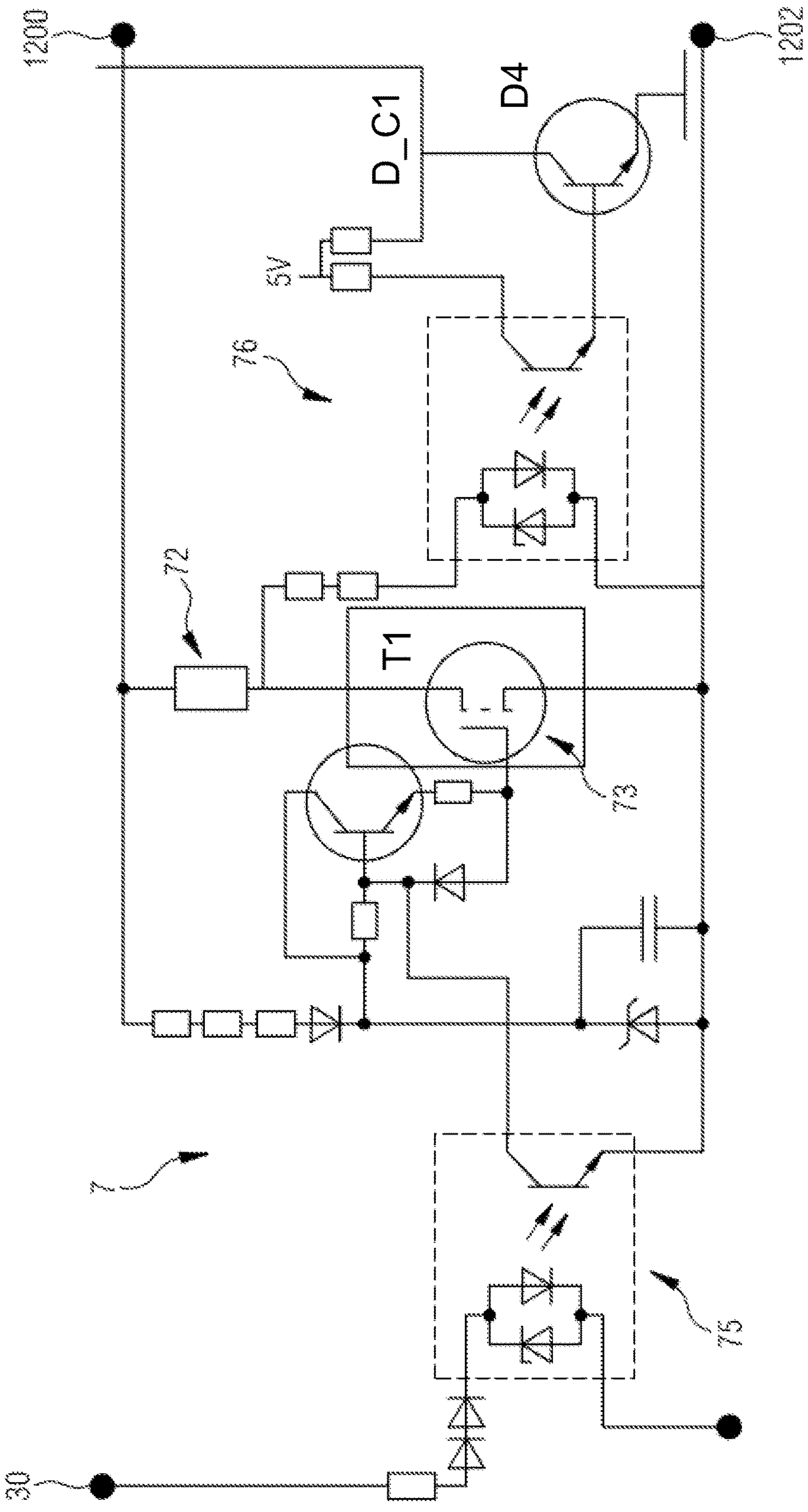
FIG. 7 shows a schematic representation of the discharge circuit and the indicator circuit according to some embodiments.

In FIG. 7, the indicator circuit 76 is designed as an optocoupler. The optocoupler is connected in parallel with the second switching element 73 between the discharging resistor 72 and the second connector 1202 of the accumulator 120. Part of the storage energy is always fed via the optocoupler, so that a slight discharge of the accumulator 120 always occurs through the discharge resistor 72. This effect is accepted here. However, when the second switching element 73 is switched and the accumulator 120 is discharged via the discharge resistor 72, an indicator switching element can be switched at the output of the optocoupler and an indicator voltage can be output through said indicator switching element. The indicator voltage is a measure here of the discharge current via the discharge resistor 72.

In the aforementioned embodiments, a discharge of the accumulator 120 can thus be triggered in a variety of ways:

If the first control voltage SIKDPS fails, for example due to a power failure, then the node 30 receives no voltage, as the DC/DC converter 5 does not generate an output voltage. On the one hand, this activates the second deactivation switch 75 of the discharge circuit 7, so that the accumulator 120 is discharged via the discharge resistor 72 of the discharge circuit 7. On the other hand, the clock generator 4 can no longer generate a switching signal, so that the driver circuit 2 is also not supplied with energy and the accumulator 120 is no longer charged indirectly via the primary circuit breakers 100.

However, the discharging of the accumulator 120 can also be triggered via the first deactivation switch 3 by interrupting the second control voltage Disablecon of the first deactivation switch 3. No voltage is then received at the node 30 either, so that the discharge circuit 7 is activated again and discharges the accumulator 120.

The discharge circuit allows the accumulator 120 to be discharged in less than 100 ms, preferably in less than 50 ms. This enables safe operation of the device, especially if it is used to operate the laser diode of a laser.

Figure 8:
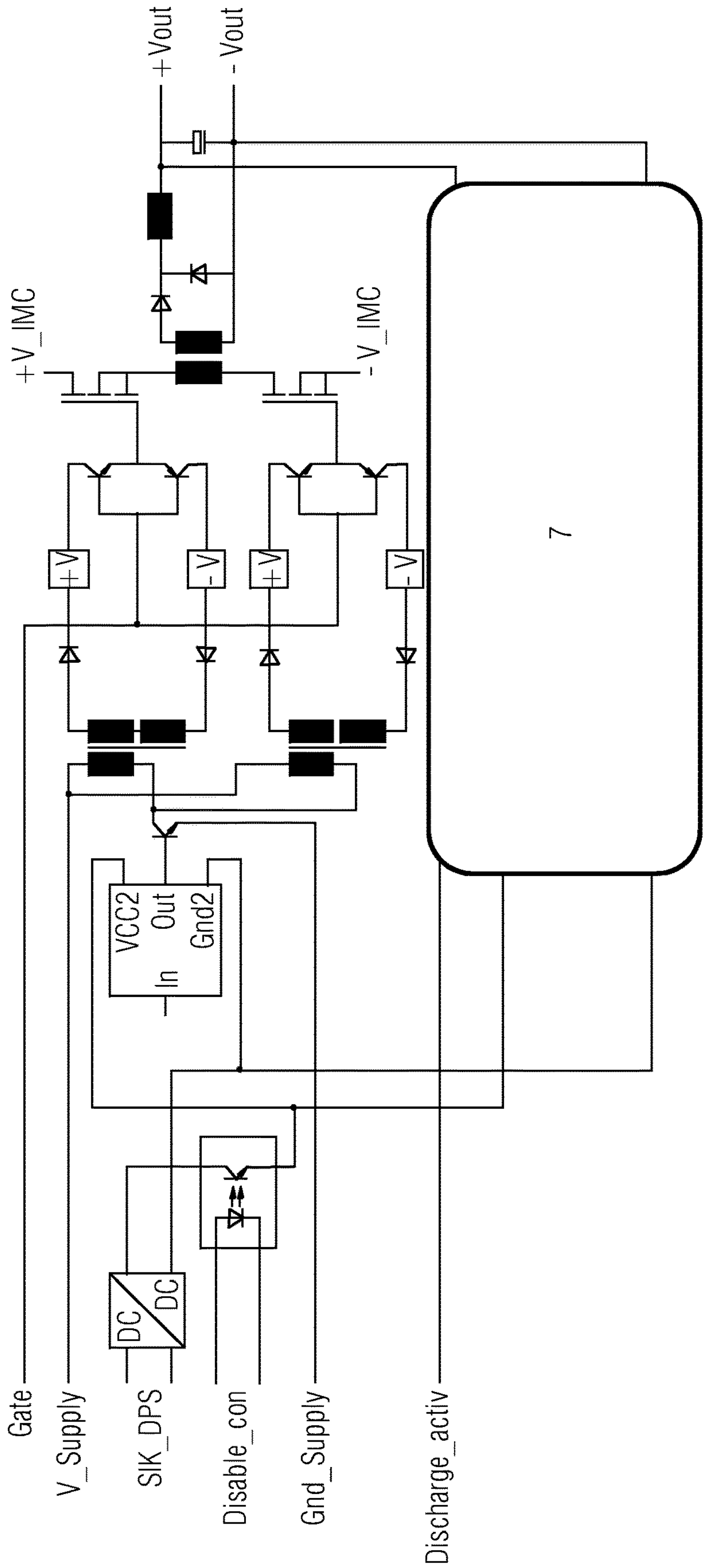
FIG. 8 shows a schematic structure of the device according to some embodiments.

FIG. 8 shows an overview circuit diagram of the device, which contains all the elements mentioned above.

Figure 9:
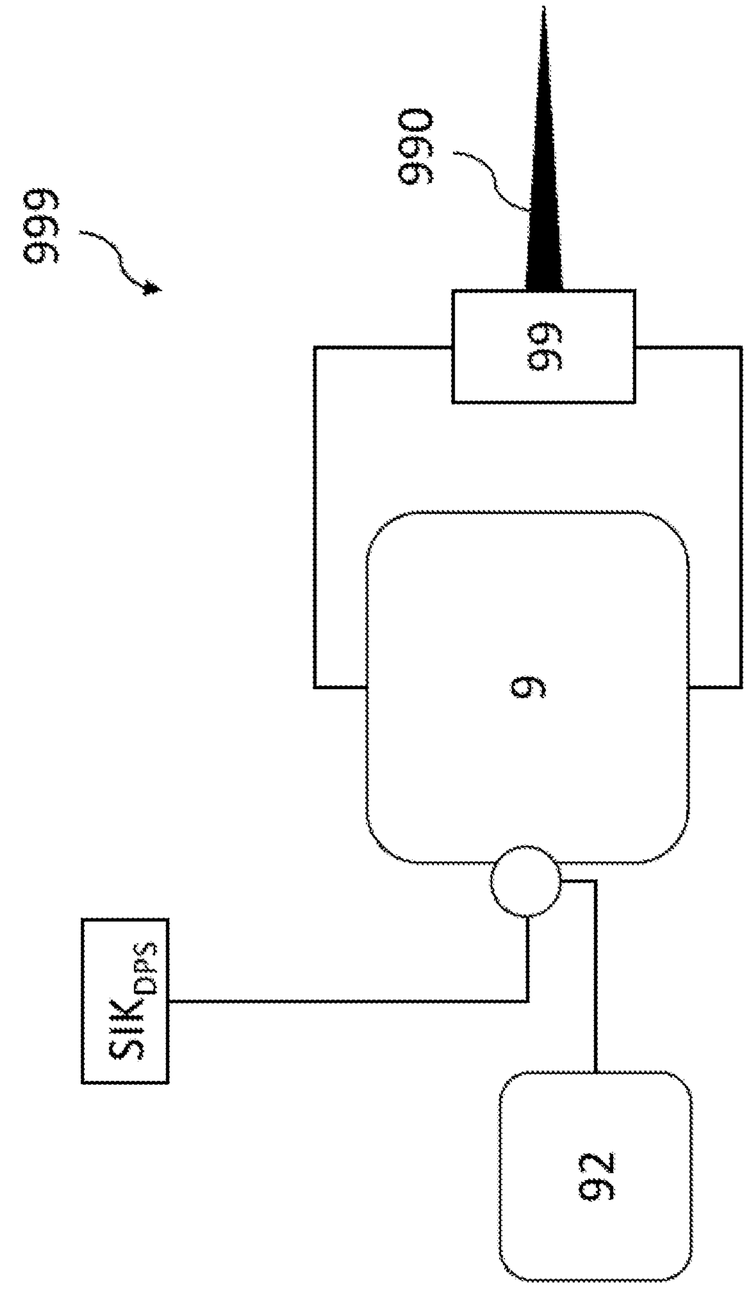
FIG. 9 shows a schematic representation of a laser system according to some embodiments.

FIG. 9 schematically shows a laser system 999 with the proposed discharge circuit.

The laser system 999 is, for example, a fiber laser system comprising at least one pump diode 99. The pump diode 99 is operated via a device 9 for generating a current driver voltage for a current driver and an associated current driver (not shown). When the device 9 receives a first control voltage SIKDPS, the pump diode 99 is powered via the current driver to provide a laser beam 990.

This laser beam 990 is to be understood as an output laser beam of the laser system 999 emerging from the laser system 999.

To provide the laser beam 990, the pump diode 99 is used, for example, to provide pump laser radiation to optically pump an active medium of the laser system 999 (not shown).

In particular, the active medium is part of an optical fiber (not shown) of the laser system 999. In this case, the laser beam 990 is the laser beam emerging from the optical fiber.

The laser system 999 has a control trigger 92. The control trigger 92 can transmit a control trigger signal to the device 9, so that a deactivation of the current driver voltage is thereby effected and thus the laser beam 990 is shut down. For example, the control trigger signal can be or provide a corresponding control voltage SIKDPS, for example an interruption of the first control voltage SIKDPS.

In particular, the device 9 of the laser system 999 can deactivate the current driver voltage and/or the laser beam 990 in less than 100 ms, preferably in less than 50 ms. For example, the device 9 can be designed according to the circuit in FIG. 8 for this purpose. Then, for example, transmitting a control trigger signal to the device 9 can cause the accumulator 120 to be discharged via the discharge circuit 7. For this purpose, the control trigger signal can, for example, interrupt the first control voltage.

Insofar as applicable, all individual features presented in the exemplary embodiments can be combined with one another and/or interchanged, without departing from the scope of the invention.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 voltage source
10 primary side
100 primary circuit breaker
1000 circuit input
12 secondary side
120 accumulator for electrical charge
1200 connection terminal
1202 connection terminal
2 driver circuit
20 primary side
22 secondary side
200 switching element
3 deactivation switch
30 node
4 clock generator
40 input
42 voltage input
44 output
5 DC/DC converter
7 discharge circuit
72 discharge resistor
73 second switching element
75 second deactivation switch
76 indicator switch
77 transistor
9 device
92 control means
99 pump diode
990 laser beam
999 laser system

The invention claimed is:

1. A device for generating a current driver voltage for a current driver of a pump diode, the pump diode for pumping a fibre laser, the device comprising:

a voltage source for generating the current driver voltage, wherein the voltage source comprises a primary side and a secondary side, wherein the secondary side is electrically isolated from the primary side, wherein the primary side comprises primary circuit breakers, and wherein the secondary side comprises an accumulator for electrical charge, wherein the voltage source is configured to generate the current driver voltage at the accumulator by switching the primary circuit breakers, a driver circuit for switching the primary circuit breakers of the voltage source, and a discharge circuit configured to receive a discharge trigger voltage and to discharge the accumulator when the discharge trigger voltage assumes a predetermined value or a value range, wherein the driver circuit and the discharge circuit are connected to a common node, a DC/DC converter configured to receive a first control voltage and to provide an output voltage at an output of the DC/DC converter based on the first control voltage, and a deactivation switch configured to receive a second control voltage and to switch an electrical connection between the output of the DC/DC converter and the common node based on the second control voltage, so that, as the output voltage of the DC/DC converter assumes the predetermined value or the value range of the discharge trigger voltage, the driver circuit switches off the primary circuit breakers of the voltage source simultaneously as the accumulator is discharged.

2. The device as claimed in claim 1, wherein the driver circuit comprises a switching element configured to receive a first switching signal and to switch on the primary circuit breakers of the voltage source based thereon.

3. The device as claimed in claim 2, further comprising a clock generator configured to receive an input clock and the discharge trigger voltage, and based on the discharge trigger voltage, to output a clocked switching signal as the first switching signal for switching the switching element.

4. The device as claimed in claim 1, wherein the deactivation switch is configured to establish an electrical connection between the output of the DC/DC converter and the common node if the second control voltage has a first value or a first value range, and to disconnect the electrical connection between the output of the DC/DC converter and the node if the second control voltage has a second value or a second value range that is different from the first value or the first value range.

5. The device as claimed in claim 1, wherein the discharge circuit comprises a second deactivation switch, a second switching element, and a discharge resistor, which is connected to a first connector of the accumulator, wherein the second deactivation switch is configured to receive the discharge trigger voltage and to switch the second switching element based on the discharge trigger voltage.

6. The device as claimed in claim 5, wherein the second deactivation switch is configured to switch on the second switching element in order to establish an electrical connection between the discharge resistor and a second connector of the accumulator, so that the accumulator is discharged via the discharge resistor if the discharge trigger voltage assumes the predetermined value or the value range, and/or the second deactivation switch is configured to switch off the second switching element in order to disconnect the electrical connection between the discharge resistor and the second connector of the accumulator, so that the accumulator is prevented from being discharged via the discharge resistor if the discharge trigger voltage does not assume the predetermined value or the value range and/or if the discharge trigger voltage is outside the predetermined value or the value range.

7. The device as claimed in claim 5, wherein the discharge circuit comprises an indicator circuit configured to output an indicator signal with a first value or a first value range when the accumulator is discharged via the discharge resistor and to output the indicator signal with a second value or a second value range when the accumulator is not discharged via the discharge resistor.

8. The device as claimed in claim 1, wherein the first control voltage and/or the second control voltage are controlled by a control trigger, wherein the control trigger is a test switch, or a door opener, or an emergency stop switch, and wherein the accumulator is discharged via the discharge circuit when the control trigger is actuated.

9. The device as claimed in claim 1, wherein when the first control voltage is interrupted in an event of a power failure or an operating fault, the accumulator is discharged via the discharge circuit.

10. The device as claimed in claim 1, wherein the discharge circuit is configured to discharge the accumulator in less than 100 ms.

11. The device as claimed in claim 1, wherein the discharge circuit is configured to discharge the accumulator up to a predetermined residual voltage.

12. The device as claimed in claim 11, wherein the discharge circuit is capable of being switched off in such a way that the accumulator retains a predetermined residual voltage in the range of from 0.1 V to 20 V, during discharge.

13. The device as claimed in claim 1, wherein the accumulator is capable of being switched at a rate between 1 Hz and 100 Hz.

14. The device as claimed in claim 1, wherein the accumulator is a capacitor, and a capacitance of the capacitor is less than 10000 μF.

15. The device as claimed in claim 1, further comprising a second discharge circuit.

16. A laser system for providing a laser beam, the laser system comprising at least one pump diode, a device as claimed in claim 1 for generating a current driver voltage for a current driver of the at least one pump diode, and a control trigger for deactivating the laser beam, wherein the control trigger is configured to transmit a control trigger signal to the device for deactivating the laser beam, and wherein the control trigger signal causes the current driver voltage to be deactivated.

17. The laser system as claimed in claim 16, wherein the device for generating the current driver voltage is configured to deactivate the current driver voltage and/or the laser beam when the control trigger signal is received in less than 200 ms.

* * * * *